(12) United States Patent
De Caro et al.

(10) Patent No.: US 8,208,315 B2
(45) Date of Patent: Jun. 26, 2012

(54) METHOD AND SYSTEM TO ACCESS MEMORY

(75) Inventors: Richard V. De Caro, El Dorado Hills, CA (US); Danut I Manea, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/052,810

(22) Filed: Mar. 21, 2011

(65) Prior Publication Data

US 2011/0170354 A1 Jul. 14, 2011

Related U.S. Application Data (62) Division of application No. 12/205,518, filed on Sep. 5, 2008, now Pat. No. 7,929,356.

(51) Int. Cl.
*G11C 16/04* (2006.01)

(52) U.S. Cl. .............. 365/189.05; 365/233.1; 365/194; 365/236

(58) Field of Classification Search ............. 365/189.05, 365/233.1, 194, 189.15, 189.011, 185.33, 365/236

See application file for complete search history.

(56) References Cited

U.S. PATENT DOCUMENTS

| 5,440,515 | A | 8/1995 | Chang et al. |
| 6,185,128 | B1 * | 2/2001 | Chen et al. ............... 365/185.11 |
| 6,891,774 | B1 * | 5/2005 | Abdollahi-Alibeik et al. .................. 365/189.02 |
| 6,950,370 | B2 * | 9/2005 | Lee ......................... 365/233.13 |
| 6,992,937 | B2 * | 1/2006 | Tran et al. ..................... 365/200 |
| 7,646,658 | B2 | 1/2010 | Chen et al. |

* cited by examiner

*Primary Examiner* — David Lam
(74) *Attorney, Agent, or Firm* — Fish & Richardson P.C.

(57) ABSTRACT

This document discusses among other things, a system comprising a host controller, an Input/Output buffer, and a memory device. The memory device is coupled to the host controller and is configured to receive a read command from the host controller. The non-volatile includes an interface control logic, which is in communication with a non-volatile memory. The interface control logic includes a latency programming circuit coupled to the non-volatile memory and the Input/Output buffer. The latency programming circuit stores at least one value corresponding to dummy byte delays to be provided at the non-volatile memory prior to transferring data from the non-volatile memory during a read operation.

11 Claims, 8 Drawing Sheets

METHOD AND SYSTEM TO ACCESS MEMORY

CROSS-REFERENCE TO RELATED APPLICATIONS

This application is a divisional (and claims the benefit of priority under 35 U.S.C. 120) of U.S. application Ser. No. 12/205,518, filed Sep. 5, 2008. The disclosure of the prior application is considered part of (and is incorporated by reference in) the disclosure of this application.

BACKGROUND

Nonvolatile memories, also known as flash memory devices, have become very popular in a variety of uses including portable memory, mobile phones, digital answering machines, hard disk drives, TVs, personal computers, and personal digital voice recorders, etc. A flash memory may be divided into sectors at the highest level, where sectors are composed of multiple blocks, blocks are composed of multiple pages, and pages are composed of hundreds of bytes, etc. Flash memories can allow for erasing at the chip, sector, block, or page level while programming can be done at the page or byte level. Reading a memory can be done at various levels and may involve varying amounts of data.

BRIEF DESCRIPTION OF THE DRAWINGS

Some embodiments are illustrated by way of example and not limitation in the figures of the accompanying drawings in which.

DETAILED DESCRIPTION

Example methods and systems described herein allow for configuring the initial latency incurred during sequential access of data from nonvolatile memories. In the following description, for purposes of explanation, numerous examples having example-specific details are set forth in order to provide a thorough understanding of example embodiments. It will be evident, however, to one skilled in the art that the present examples may be practiced without these example-specific details.

With some memory devices, to conduct a read operation, a read command is given which includes a starting memory address. After allowing a fixed time delay for internal read operations and address decoding, a first byte of data is available commencing from the initial address given. The delay from the time of read command input to that of data output degrades the efficiency of random and continuous read operations. Moreover, such delays can drastically impact system performance and inhibit the ability to execute program code directly from the memory device.

Memory System

Figure 1:
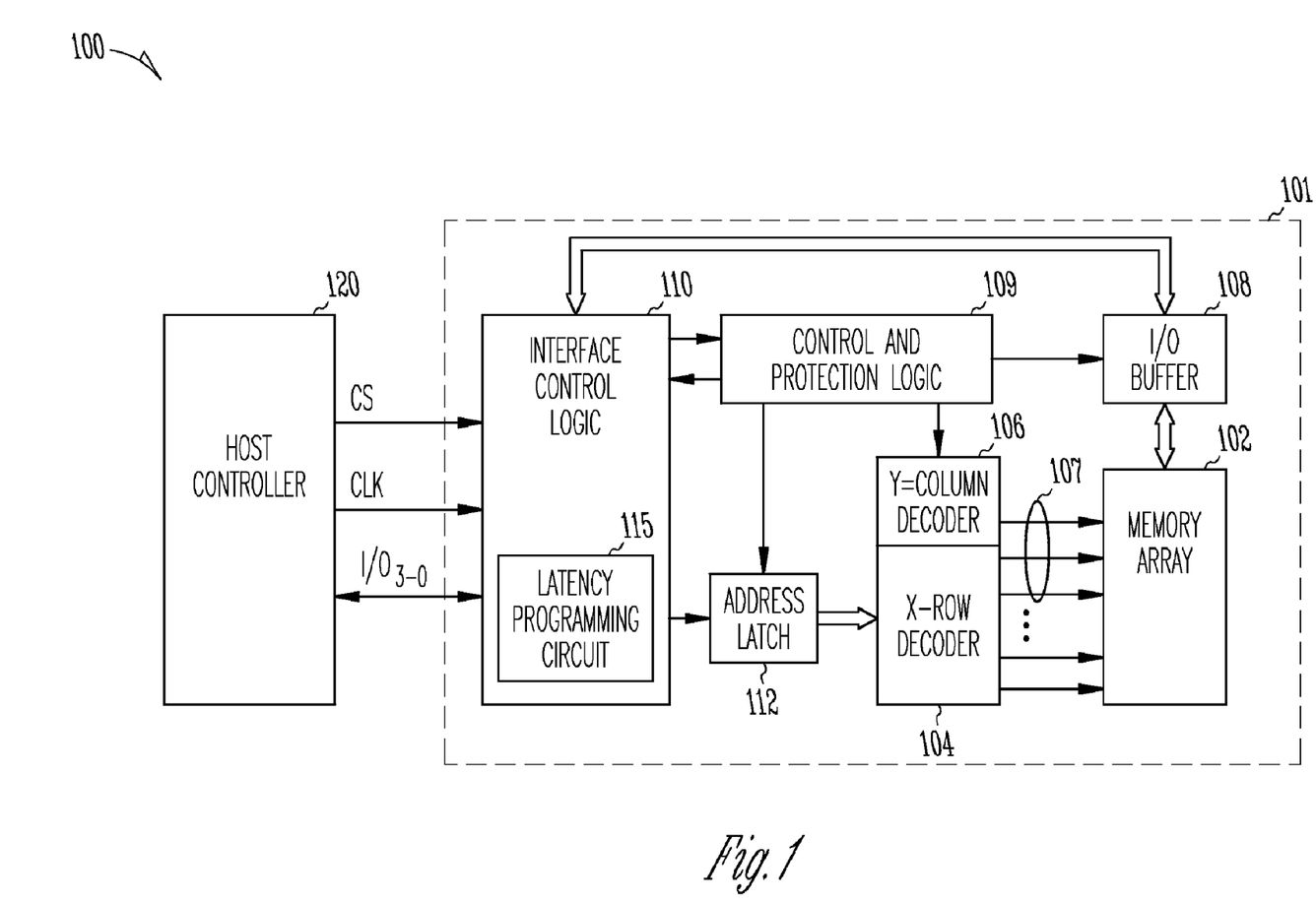
FIG. 1 is a block diagram of a memory system including a memory device, according to some embodiments of the invention.

FIG. 1 illustrates a block diagram of a system 100 to sequentially access a memory array, according to some embodiments of the invention.

System 100 includes a memory device 101 coupled to a host controller 120. Memory device 101 includes a memory array 102, an X row decoder 104, a Y column decoder 106, an Input/Output (I/O) buffer 108, a control and protection logic 109, and interface control logic 110. Interface control logic 110 includes latency programming circuit 115 and is coupled to host controller 120.

Memory array 102 includes a plurality of memory locations (e.g., bits or elements), organized into rows and columns. Each row (also sometimes known as page or wordline) of memory array 102 is addressed by an X portion of the memory address, and each column of memory array 102 within a page is addressed by a Y portion of the memory address. Each column of the memory array 102 (also sometimes known as bitline 107) is electrically connected to a plurality of memory locations. In this arrangement, each memory location is identified by a unique combination of one X and one Y address. An address is fed into an address latch (buffering circuit) 112. Address latch 112 provides the X portion of a target address and the Y portion as well. The X portion of the address feeds into the X row decoder 104 which is coupled to the memory array 102 and selects the specified memory page. The Y portion of the address feeds into Y column decoder 106 which selects the specified memory bit location in the selected page. In some examples, Y column decoder 106 includes sense circuitry for electrically sensing the bit lines of an accessed memory location. Y column decoder 106 further includes circuitry for outputting the bits of the target memory location. Interface control logic 110 accepts an externally provided serial bit stream and feeds it into I/O buffer 108. I/O buffer 108 includes circuitry for storing a bit stream to be written to a page or a portion thereof. Interface control logic 110 provides control signals and timing signals for operating the various components within memory device 101.

In FIG. 1, host controller 120 controls memory device 101 by, for example, sending a set of instructions to the interface control logic 110. The host controller 120 communicates with the interface control logic 110 via the chip select (CS) and clock (CLK) lines as well bidirectional bus. In one example, as shown here, the bidirectional bus is a 4-bit ($I/O_{3-0}$) bus. However, the present disclosure is not limited to 4-bit bus and may include various buses, including any $2^N$ bit bus. In some embodiments, host controller 120 is commonly referred to as a Serial Peripheral Interface Master. In an example, the host controller 120 communicates with the memory device 101 via a Serial Peripheral Interface (SPI) bus, which has dedicated serial input and serial output lines.

In some examples, the timing is referenced from the rising edge of CLK; therefore, data can be latched in and outputted on the rising edge of CLK. In some examples, the timing can be referenced from the falling edge of CLK. In the case of an SPI implementation, both the rising edge and falling edge of CLK are used. A valid instruction or operation can be started by first asserting the CS line. After the CS signal on the CS line has been asserted, the host controller 120 clocks out a valid n-bit operational code (e.g., 8-bit) on the 4-bit bidirectional bus ($I/O_{3-0}$). Following the operational code, instruction dependent information such as address and data bytes would then be clocked out by the host controller 120. An operation is ended by de-asserting the CS signal on the CS line. In one example, the operation codes not supported by memory device 101 will be ignored and no operation will be started. As a result, memory device 101 would continue to ignore any data presented on the $I/O_{3-0}$ pins until the start of the next operation (CS pin being de-asserted and then re-asserted). Additionally, if the CS line is de-asserted before the complete operational code and address information is sent to the device, then no operation will be performed and the memory device 101 will simply return to the idle state and wait for the next operation. In an example, addressing memory device 101 requires a total of three bytes of information to be sent, representing address bits A23-A0.

In one example, memory device 101 includes a sequential access memory device (e.g. serial EEPROMs and serial Flash). In such a sequential access memory device, commands or operation codes are sent from the host controller 120 to the memory device 101 in order to read various types of data (e.g., memory array data, status register data, serial number/security register data, etc.) from the memory device 101. The reading of data can be done at any clock frequency up to the maximum supported by the memory device 101. When reading data at relatively high clock frequencies, the memory device 101 may not have enough time to decode the command, operational code or the address information sent by the host controller 120 before it outputs data back to the host controller 120. If the memory device 101 does not have enough time to decode the command, operational code or the address information, then erroneous data may be output by the memory device 101.

In another example, a READ command would necessitate accessing data from different address locations in a memory array 102. Moving (jumping) from one location of the memory array 102 to another can be completely random and this random jumping to access data from the memory array 102 results in additional delays during a READ operation. Random jumps are those in which a read access is not limited to a specific portion of the memory array 102 but instead can be done to any location within the memory. Index jumps may require that a jump is done to a presently indexed location or column. For example, an index jump would allow a READ to access byte location 5 of a word line and then jump to byte location 5 of another word line. In some embodiments, index jumps may be referred to as base and offset jumps.

To address problems similar to the those described above, sequential access memory devices offer multiple commands/operational codes that can be used for higher clock frequency reads and can require that the host controller wait a time period corresponding to a fixed number of clock cycles by sending dummy bytes to the memory device 101 before the memory device 101 will start outputting data. The use of fixed numbers of dummy bytes gives the memory device 101 additional time to decode the command, operational code or address information so that it can output correct data.

However, in conventional memory devices the number of fixed dummy bytes used remains the same irrespective of the clock frequency of the host controller 120 during a READ operation from the memory device 101. For instance, the number of dummy bytes used for a clock frequency of 100 KHz is the same as the number of dummy bytes used for a clock frequency of 1 MHz for the host controller 120. This type of configuration may result in unnecessary delays because of sub-optimal performance of memory device 101 while extracting data during a READ operation.

Moreover, the use of fixed numbers of dummy bytes generates long initial latencies or access times that are created by having to wait a time period corresponding to a number of dummy bytes that is more than what is necessary for latching data from the memory array 102 into the I/O buffer 108 and subsequently output from the memory device 101 after a READ command is recognized by the interface control logic 110. By being able to configure the number of dummy bytes needed for a READ operation as opposed to using a fixed number of dummy bytes, the initial latency can be optimized for any given clock frequency. Long latencies or access times result in a long delay before the first byte of information can be read out of the memory device 101. Furthermore, since the number of fixed dummy bytes is usually provided for the highest clock frequencies available, the delays are even more protracted when used in applications with a lower clock frequency. By using configurable number of dummy bytes, the design allows for not having to decode several opcodes (and having associated logic) for different clock frequency ranges, which saves on design overload and helps in reducing die size.

Although other systems and methods that involve complex fixed-length bursting schemes or complex index jumps can be provided to reduce latency, they have drawbacks by limiting the length of the amount of data being read or by limiting where the next read can be performed. The methods and systems provided herein allow for a simplistic approach to deal with the issue of long initial latency or access times caused by the use of fixed dummy bytes. Reading from the memory device 101 can be performed without any significant changes to existing configurations and does not limit the amount of data that can be read. Additionally, the system and methods provided herein do not limit the ability to perform pure random reads whereas using complex index jumps does prevent performing pure random reads. In an example, a customer can optimize the speed of execution of a READ operation by selecting the number of dummy bytes necessary for particular READ commands where the number of dummy bytes is stored in a register or registers associated with memory device 101.

In one example, a READ command can be used to sequentially read a continuous stream of data from the memory device 101 by providing the clock signal once the initial starting address has been specified. The memory device 101 incorporates an internal address counter that automatically increments on every clock cycle or after a number of clock cycles depending on the number of bits being read internally in the device at one time and the number of bits being output during a clock cycle.

Operational codes are used for READ commands in memory device 101. In one example, three operational codes (e.g., 1Bh, 0Bh, and 03h) can be used for the READ array command as shown in Table 1. The use of these operational codes depends on the maximum clock frequency that will be used to read data from the device and can require a certain number of dummy bytes to be clocked into the device before initial data can be read. In one implementation, the number of dummy bytes to be used can be configured to optimize the READ operation in terms of latency depending on the application in which memory device 101 is used. For example, if the starting address to be read is always aligned to an 8-byte boundary (e.g., 000000h, 000008h, 000010h, 000018h, etc.), then significantly less dummy bytes are required to perform a read at a given frequency because of internal buffering and the internal address decoding scheme. This can significantly reduce overhead and initial latency in applications that are designed to shadow blocks of code or for applications that utilize 64-bit instructions and data.

Table 1 shows the number of address bytes and dummy bytes related to the various types of commands (e.g., Read commands and Write commands) and their associated opcodes along with the range of example clock frequencies.

TABLE 1

| Command | Opcode | Clock Frequency | Address Bytes | Dummy Bytes | Data Bytes |
|---|---|---|---|---|---|
| Read Commands | | | | | |
| Read Array | 1Bh 0001 1011 | Up to 150 MHz | 3 | $n^{(1)}$ | 1+ |
| | 0Bh 0000 1011 | Up to 150 MHz$^{(2)}$ | 3 | 4 | 1+ |
| | 03h 0000 0011 | Up to 85 MHz$^{(2)}$ | 3 | 2 | 1+ |
| Protection Commands | | | | | |
| Read Sector Protection Registers | 3Ch 0011 1100 | Up to 150 MHz | 3 | 0 | 1+ |
| Security Commands | | | | | |
| Read Sector Lockdown Registers | 35h 0011 0101 | Up to 150 MHz | 3 | $n^{(1)}$ | 1+ |
| Read OTP Security Register | 77h 0111 0111 | Up to 150 MHz | 3 | $n^{(1)}$ | 1+ |
| Status and Configuration Register Commands | | | | | |
| Read Status Register | 05h 0000 0101 | Up to 150 MHz | 0 | 0 | 1+ |
| Read Configuration Register | 3Fh 0011 1111 | Up to 150 MHz | 0 | 0 | 1+ |
| Write Configuration Register | 3Eh 0011 1110 | Up to 150 MHz | 0 | 0 | 1 |

Table 1 includes note (1), which indicates the number of dummy bytes n being configurable and set with the Configuration Register. In one example, the default value after power-up for the number of dummy bytes is eight. Table-1 also includes note (2), which indicates the maximum clock frequency possible if the read is aligned to an 8-byte boundary in one embodiment.

In one example, a first operational code (e.g., 0Bh) may require the use of four dummy bytes and can be used at any clock frequency up to a maximum frequency ($f_1$) for non-aligned, random reads or up to a frequency ($f_2$) for 8-byte aligned reads. A second operational code (e.g., 03h) may require the use of two dummy bytes that can be used at any clock frequency up to a maximum frequency ($f_3$) for non-aligned, random reads or up to frequency ($f_4$) for 8-byte aligned reads. A third operational code (e.g., 1Bh) defaults to eight dummy bytes after device power-up but can be easily reconfigured using the Write Configuration Register command (shown in Table-1) to set the optimal value of dummy bytes that may be needed for the clock frequency of memory device 101. With the default power-up value of eight dummy bytes, the third operational code (e.g., 1Bh) can be used up to the maximum clock frequency specified by ($f_5$) for non-aligned, random reads or up to ($f_6$) for 8-byte aligned reads. In one example, configuring the 1Bh operational codes with the highest number of dummy bytes as outlined in Table 2 will allow the memory device 101 to be read at the highest clock frequency possible.

In one example, to perform the READ operation, the CS line is first asserted and the appropriate operational code (e.g., 1Bh, 0Bh, or 03h) can be clocked into the memory device 101. After the operational code has been clocked in, the three address bytes are clocked in to specify the starting address location of the first byte to read within the memory array 102.

Following the three address bytes, additional dummy bytes are clocked in to the memory device 101 with the number of dummy bytes depending on which operational code has been used for the Read array operation. If the first operational code (e.g., 0Bh) is used, then four dummy bytes are clocked in. If the second operational code (e.g., 03h) is used, then two dummy bytes can be clocked in after the three address bytes. If the third operational code (e.g., 1Bh) is used, then a Configuration Register (such as a programmable latency register 204 in FIG. 2, also known as Programmable Latency register) defines the number of dummy bytes to be clocked into the memory device 101 after the three address bytes. In one example, the default number of dummy bytes for 1Bh opcode after power-up is 8.

Table 2 shows examples of how many dummy bytes may be needed for a READ operation for given ranges of clock frequencies and if the READ operation would be aligned to an 8-byte boundary. The table also highlights the time it would take to read the first byte of data at given clock frequency ranges and the time to read subsequent bytes.

TABLE 2

| Clock Frequency | Number of Dummy Bytes Required | | Initial Byte Access Time (Opcode + Address + Dummy + First Byte of Data) | | Subsequent Byte Access Time |
| --- | --- | --- | --- | --- | --- |
| | Non-Aligned, Random Read | 8-Byte Aligned Read | Non-Aligned, Random Read | 8-Byte Aligned Read | |
| 150 MHz to 126 MHz | 6 | 4 | 146.7 ns to 174.6 ns | 120.0 ns to 142.9 ns | 13.3 ns to 15.9 ns |
| 125 MHz to 86 MHz | 4 | 3 | 144.0 ns to 209.3 ns | 128.0 ns to 186.0 ns | 16.0 ns to 23.3 ns |
| 85 MHz to 67 MHz | 3 | 2 | 188.2 ns to 238.8 ns | 164.7 ns to 209.0 ns | 23.5 ns to 29.9 ns |
| 66 MHz to 51 MHz | 2 | 1 | 212.1 ns to 274.5 ns | 181.8 ns to 235.3 ns | 30.3 ns to 39.2 ns |
| 50 MHz to 34 MHz | 1 | 1 | 240.0 ns to 352.9 ns | 240.0 ns to 352.9 ns | 40.0 ns to 58.8 ns |
| 33 MHz or less | 0 | 0 | 303.0 ns or more | 303.0 ns or more | 60.6 ns or more |

After the three address bytes and the dummy bytes have been clocked in, additional clock cycles will result in data being output on the I/O$_{3-0}$ lines. In one example, the data is always output with the most-significant nibble (4-bits in length) of a byte first. When the last byte of the memory array 102 has been read, the device will continue reading back at the beginning of the array (0000000h). No delays will be incurred when wrapping around from the end of the memory array 101 to the beginning of the array or from moving from one address to the next sequential address. De-asserting the CS line will terminate the read operation and put the I/O$_{3-0}$ lines into a high-impedance state. The CS pin can be de-asserted at any time and does not require that a full byte of data be read.

Interface Control Logic

Figure 2:
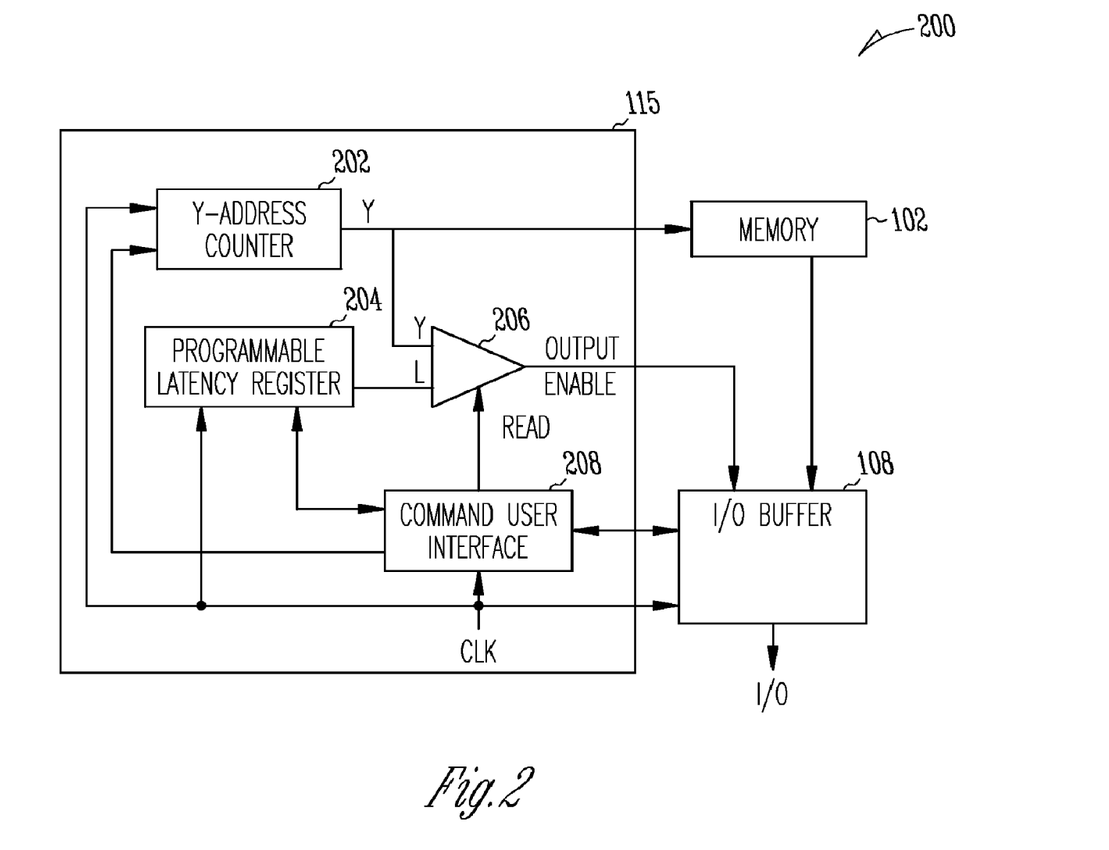
FIG. 2 is a block diagram of a system including a circuit to configure dummy bytes during the execution of a READ array operation, according to some embodiments of the invention.

FIG. 2 illustrates a block diagram of a system 200 including the latency programming circuit 115 used to configure the number of dummy bytes used during the execution of a READ array operation, according to some embodiments of the invention. Latency programming circuit 115 includes a Y-address counter 202, a programmable latency register 204, a comparator 206 and a command user interface 208. Latency programming circuit 115 is coupled to memory 102 and I/O Buffer 108. A clock (CLK) signal is provided to each of the modules Y-address counter 202, programmable latency register 204, command user interface 208 and I/O buffer 108. Programmable latency register 204 can be used to configure the number of dummy bytes to be used during the execution of a READ array operation. In one example, the number of dummy bytes to be used during the execution of a read command is provided in a look-up table.

In operation, in an example, comparator 206 receives a READ command from the command user interface 208. In an example, comparator 206 compares the bit values between the output of Y-address counter 202 and the output L of the programmable latency register 204. When a match is detected an output enable signal is sent to the I/O buffer 108.

In an example, a Configuration Register (which can be present within the memory array 102) can be read to determine the number of dummy bytes that has been set for the 1Bh Read Array operational code as well as the Read Sector Lockdown Register and Read OTP (One-Time Programmable) Security Register commands. In an example, to read the Configuration Register, the CS line is first asserted and the operational code of 3Fh is clocked into the device. After the operational code has been clocked in, the memory device 101 will begin outputting the one byte of Configuration Register data on the I/O$_{3-0}$ line during subsequent clock cycles. The data being output will be a repeating byte as long as the CS line remains asserted and the clock (CLK) line is being pulsed.

The Configuration Register can be either volatile or non-volatile. In a volatile scheme, the Configuration Register can be created using RAM cells, flip-flops, registers, etc. In a non-volatile implementation, the Configuration Register can be created using a portion of the memory array 102 itself, a series of non-volatile fuses, a content addressable memory (CAM) array, or EEPROM cells. In one example, at least one value corresponding to the number of dummy bytes to be used during the operation of a read command can be hardwired using blow-out fuses.

In one example, the configurable number of dummy bytes can be stored in a volatile location, wherein the device can power-up with a default number of dummy bytes. This default number of dummy bytes in various embodiments allows the application to boot at whatever frequency possible and then later optimize the number of dummy bytes based on the system clock frequency. In some applications, the host controller 120 powers up and accesses the memory device 101 with a slower clock frequency and then later throttles the clock frequency to the memory device 101 to a higher level after a certain amount of code/data has been processed. In some examples, by using a volatile location to store the number of dummy bytes, an application does not have to worry about a finite endurance or number of times that the number of dummy bytes can be changed.

In one example, storing the number of dummy bytes in a non-volatile location allows for the number of dummy bytes to be configured only once. This allows an application to always have the number of dummy bytes optimally set on every power-up/boot operation. The number of dummy bytes can default to some value when the memory device is initially manufactured and tested. The number of dummy bytes can then be configured using an external programmer or during an application's ICT (in-circuit test) or manufacture so that when the application powers-up, even for the first time, the number of dummy bytes will already be optimized for that application.

In one example, a memory device could incorporate both a volatile and non-volatile storage location for the configurable number of dummy bytes. Upon device power-up, if the non-volatile storage location does not contain a valid value, then the memory device could default to using the volatile location (along with a default value of dummy bytes) to determine the number of dummy bytes needed for the 1Bh read command. If the non-volatile location does contain a valid value, then the memory device can use that value as the primary value and not check what value is stored in the volatile location.

In one example, a Write Configuration Register command (shown in Table 1) is used to set the number of dummy bytes for any one of a Read Sector Lockdown Register command, a Read OTP Security Register command, and the 1Bh Read Array operational code. The Read Sector Lockdown Register command allows for determining the current lockdown status of a sector in the memory array 102. The Read OTP Security Register command can be used to read special data such as device identifiers, system-level Electronic Serial Numbers (ESNs), locked keys, etc., that would be stored in a special part of the memory device 101.

The 1Bh Read Array operational code shown in Table 1 permits the maximum level of memory read performance possible, and using the Write Configuration Register command allows the number of dummy bytes for the 1Bh operational code to be set to match the clock frequency of memory device 101.

The number of dummy bytes that may be needed for the 1Bh Read Array operational code may be optimized depending upon the application itself. In one example, if the starting address to be read is aligned to an 8-byte boundary (e.g. 000000h, 000008h, 000010h, 000018h, etc.), then less dummy bytes may be required for the initial access for a read at a given clock frequency. The Read Sector Lockdown Register and Read OTP Security Register commands are considered non-aligned reads.

In one example, the 1Bh Read Array operational code defaults to eight dummy bytes after power-up to provide compatibility with future devices and can be reconfigured at any time to any value as listed in Table-2.

Examples of Clock Cycles Corresponding to Various Read Array Commands

Figure 3:
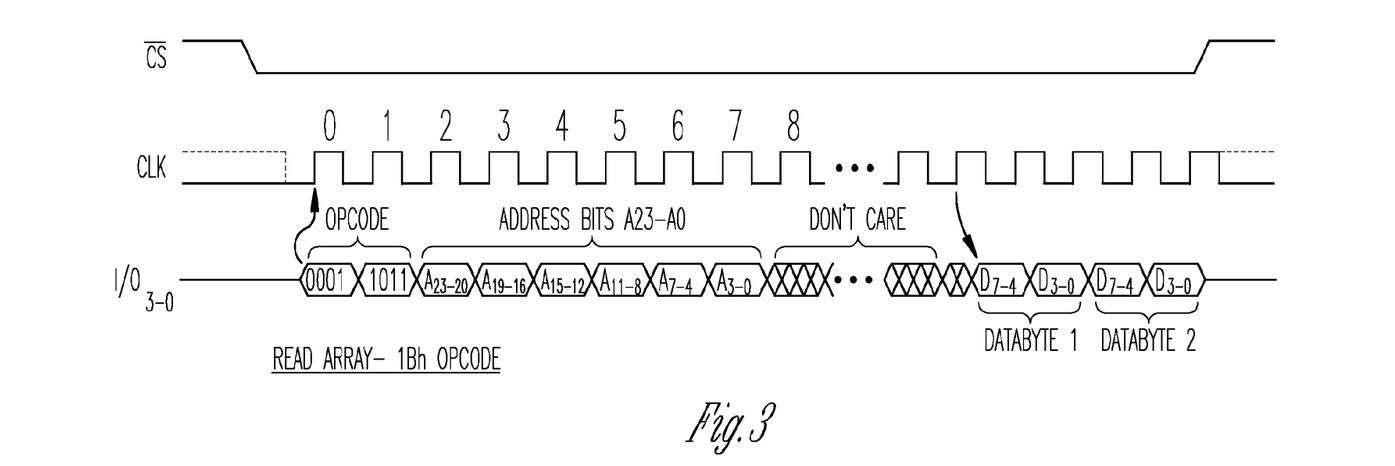
FIG. 3 is an example of a clock cycle corresponding to a READ array command using an operation code, according to some embodiments of the invention.

FIG. 3 illustrates an example of a clock cycle corresponding to a READ array command using a 1Bh operation code, according to some embodiments of the invention. As shown in FIG. 3, the I/O$_{3-0}$ lines first carry the 1Bh operational code followed by three address bytes. Following the address bytes, a configurable number of dummy bytes are sent. Following the configurable number of dummy bytes, the data bytes are output from the memory device 101. As shown in Table 1, the maximum clock frequency for this operation in one example is 150 MHz.

Figure 4:
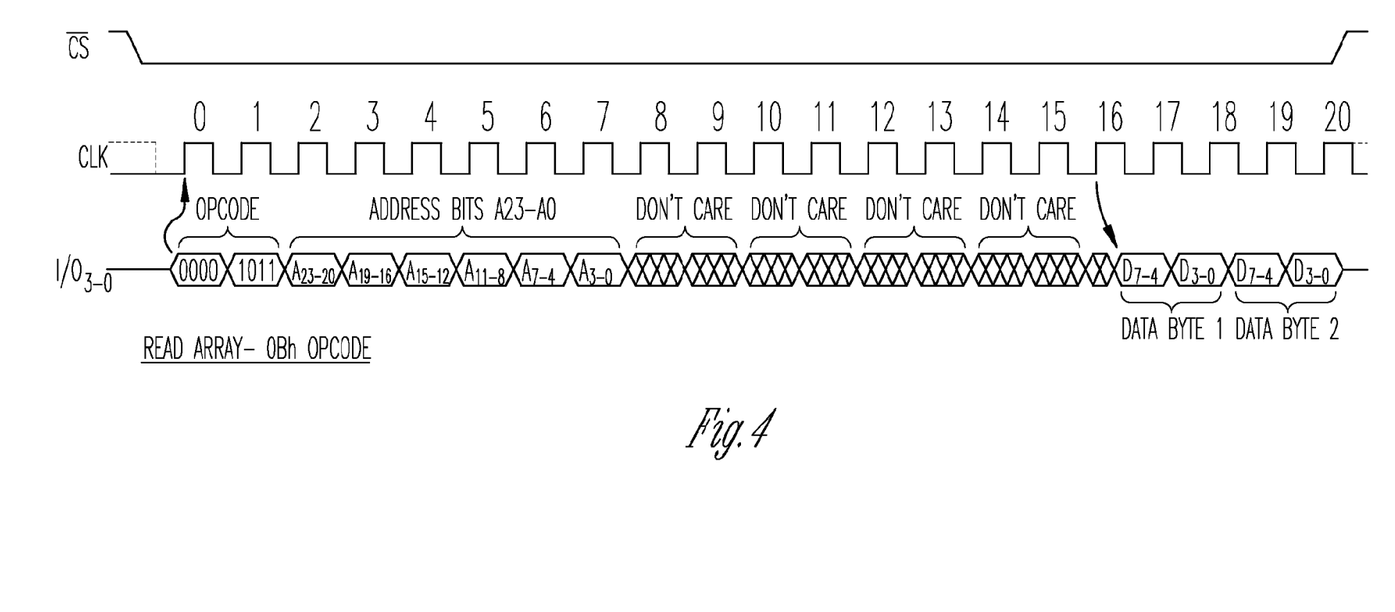
FIG. 4 is an example of a clock cycle corresponding to a READ array command using an operation code, according to some embodiments of the invention.

FIG. 4 illustrates an example of a clock cycle corresponding to a READ array command using a 0Bh operation code, according to some embodiments of the invention. As shown in FIG. 4, the I/O$_{3-0}$ lines first carry the 0Bh operational code followed by three address bytes. Following the address bytes, four dummy bytes are sent. Following the four dummy bytes, the data bytes are output from the memory device 101. As shown in Table 1, the maximum clock frequency for this operation in one example is 150 MHz.

Figure 5:
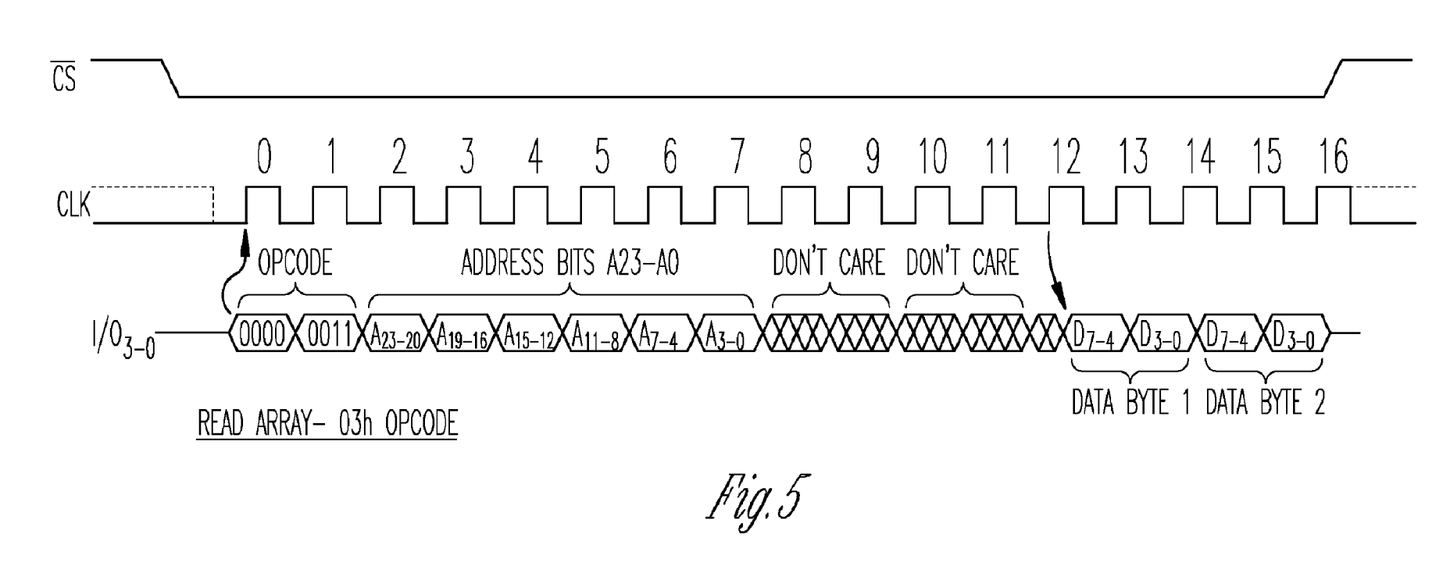
FIG. 5 is an example of a clock cycle corresponding to a READ array command operation using an operation code, according to some embodiments of the invention.

FIG. 5 illustrates an example of a clock cycle corresponding to a READ array command operation using a 03h operation code shown in Table 1, according to some embodiments of the invention. As shown in FIG. 5, the I/O$_{3-0}$ lines first carry the 03h operational code followed by three address bytes. Following the address bytes, two dummy bytes are sent. Following the two dummy bytes, the data bytes are output from the memory device 101. As shown in Table-1, the maximum clock frequency for this operation in one example is 85 MHz.

Figure 6:
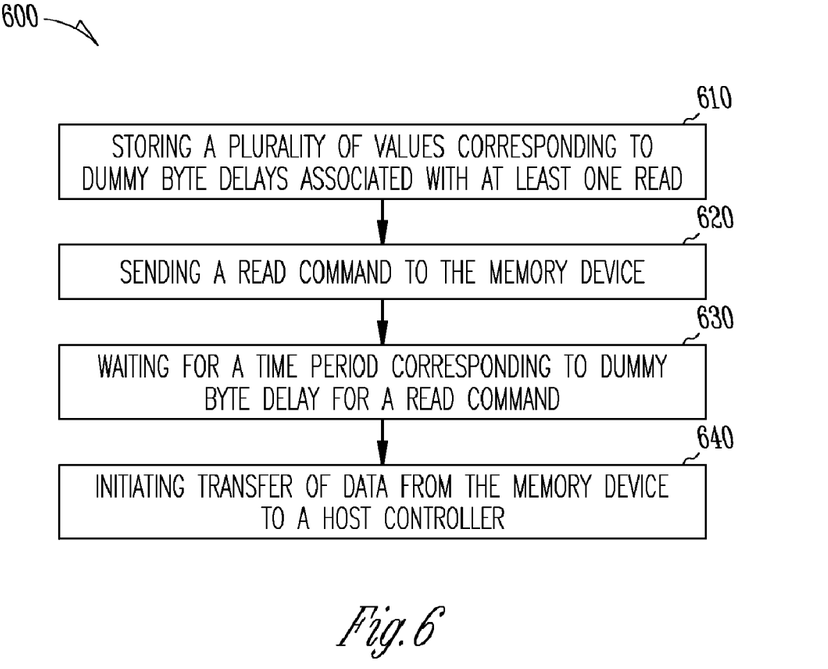
FIG. 6 is a flow chart describing a method of transferring data from a memory device to a host controller, according to some embodiments of the invention.

Flow Chart Describing a Method for Transferring Data from a Memory Device to a Host Controller FIG. 6 is a flow chart describing a method 600 for transferring data from a memory device (e.g., memory device 101) to a host controller (e.g., host controller 120), according to some embodiments of the invention. At block 610, method 600 includes storing a plurality of values corresponding to dummy byte delays associated with at least one READ. At block 620, method 600 includes sending a READ command to the memory device 101. At block 630, method 600 includes waiting a time period corresponding to the number dummy byte used for a particular READ command. At block 640, method 600 includes initiating the transfer of data from the memory device 101 to a host controller 120.

Flow Chart Describing a Method of Manufacturing a Memory Device

Figure 7:
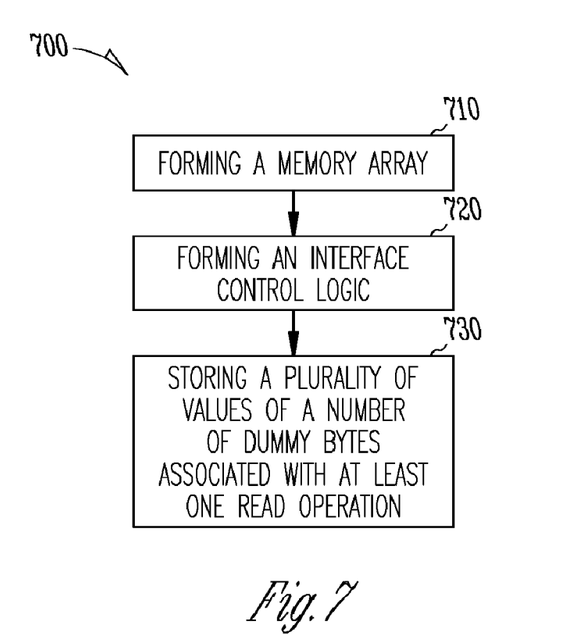
FIG. 7 is a flow chart describing a method of manufacturing a memory device, according to some embodiments of the invention.

FIG. 7 is a flow chart describing a method 700 of manufacturing a memory device (e.g., memory device 101), according to some embodiments of the invention. At block 710, method 700 includes forming a memory array (e.g., memory array 102). At block 720, method 700 includes forming an interface control logic (e.g., interface control logic 110) that can communicate with the memory array 120. At block 730, method 700 includes storing a plurality of values of a number of dummy bytes associated with at least one READ operation.

Flow Chart Describing a Method of Using a Memory Device

Figure 8:
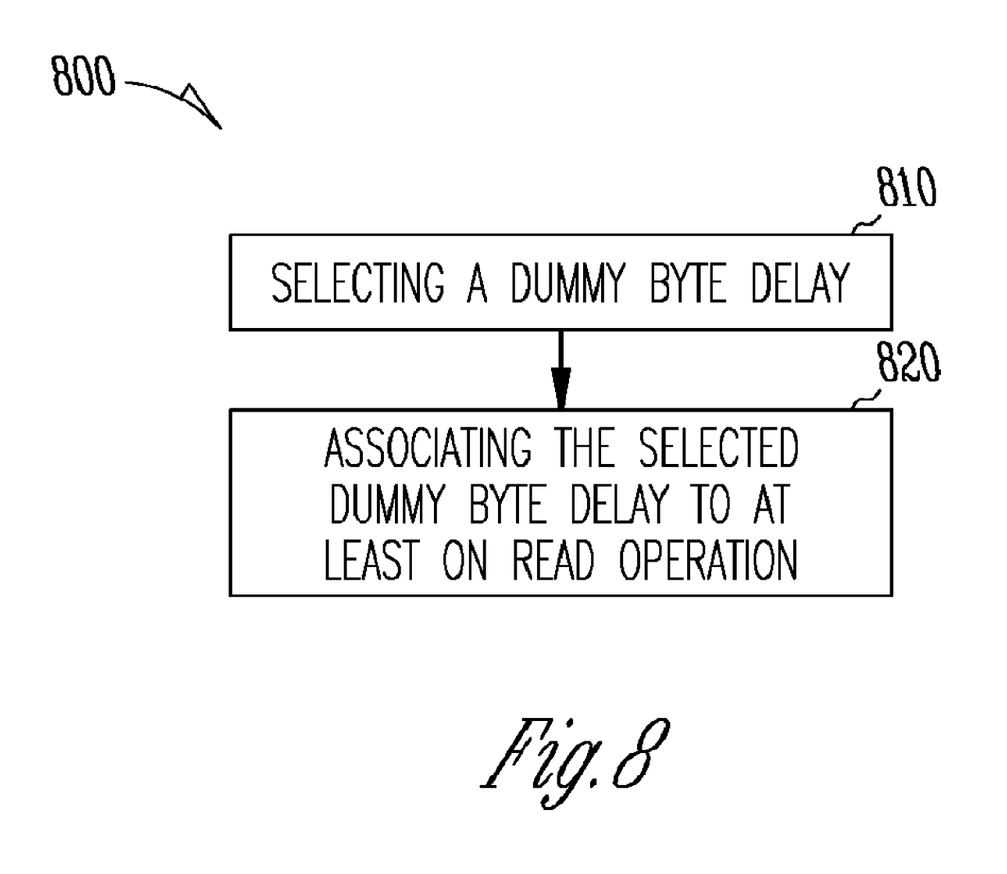
FIG. 8 is a flow chart describing a method of using a memory device, according to some embodiments of the invention.

FIG. 8 is a flow chart describing a method of using a memory device e.g., memory device 101), according to some embodiments of the invention. At block 810, method 800 includes selecting a particular dummy byte delay. Depending on implementations, selecting a particular dummy byte delay could be done by obtaining the delay value either from a non-volatile or volatile storage location. At block 820, method 800 includes associating the selected dummy byte delay to at least one READ operation. In one example the READ operation can include any of the READ operations listed in Table-1.

Flow Charts of Methods of Reading a Memory Using Various Operational Codes

Figure 9:
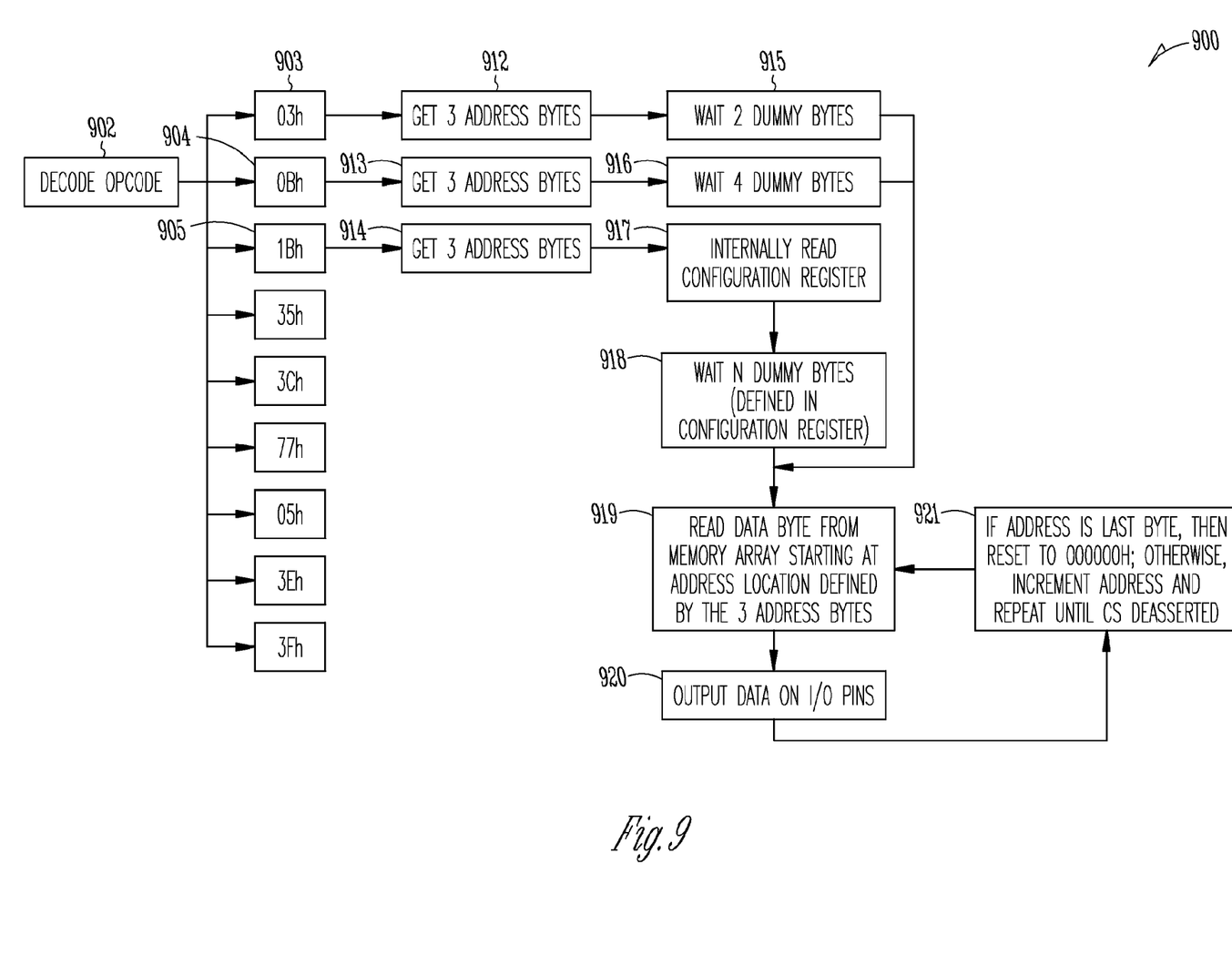
FIG. 9 illustrates a flow diagram of a method of reading a memory using at least one of operational codes 03h, 0Bh and 1Bh, according to some embodiments of the invention.

FIG. 9 illustrates a flow chart of a method 900 of reading a memory array 102 using at least one of operational codes 03h, 0Bh and 1Bh, according to some embodiments of the invention. At block 902, method 900 includes decoding opcodes. The opcodes can include various opcodes (e.g., 03h, 0Bh, 1Bh, 35h, 3Ch, 77h, 05h, 3Eh, 3Fh). This example of FIG. 9, however, is limited to only opcodes 03h, 0Bh, and 1Bh. In one example, when an opcode (for e.g., 03h) is decoded, method 900 proceeds to block 912. At block 912, method 900 includes receiving 3 address bytes and the method 900 proceeds to block 915. At block 915, method 900 waits a time period equal to 2 dummy bytes (which may also be considered as a delay time equivalent to clock cycles for 2 bytes before the method proceeds to block 919). After waiting a time period of 2 dummy bytes as in block 915, the method 900 proceeds to block 919. At block 919, in one example, method 900 includes reading data in bytes from memory array 102 starting at an address location defined by the 3 address bytes received in block 912. After reading the data in block 919, method 900 proceeds to block 920. At block 920, method 900 includes providing output data on Input/Output (I/O) pins. After outputting read data onto the I/O pins, method 900 proceeds to block 921. At block 921, method 900 resets the last byte to 0000000h if the address is the last byte of the memory array 102. If the address received in block 912 is not the last byte of the memory array 102, then the address is incremented and method 900 proceeds to 919, where, in one example, the read process is repeated until the chip select (CS) line (shown in FIG. 1) is de-asserted.

In one example, when an opcode (for e.g., 0Bh) is decoded, method 900 proceeds to block 913. At block 913, method 900 includes receiving 3 address bytes. Upon receiving the 3 address bytes in block 913, method 900 proceeds to block 916. At block 916, method 900 waits a time period equal to 4 dummy bytes (which may also be considered as a delay time equivalent to clock cycles for 4 bytes before the method proceeds to block 919). Method 900 continues to block 919, 920 and 921 as explained above for opcode 03h.

In one example, when an opcode (for e.g., 1Bh) is decoded, method 900 proceeds to block 914. At block 914, method 900 includes receiving 3 address bytes. Upon receiving the 3 address bytes in block 914, method 900 proceeds to block 917. At block 917, method 900 reads data from a Configuration Register (for e.g., a programmable latency register 204). Method 900 proceeds to block 918, where method 900 waits "n" number of dummy bytes defined in the Configuration Register. Method 900 proceeds to block 919, 920 and 921 as explained above for opcode 03h and 0Bh.

Figure 10:
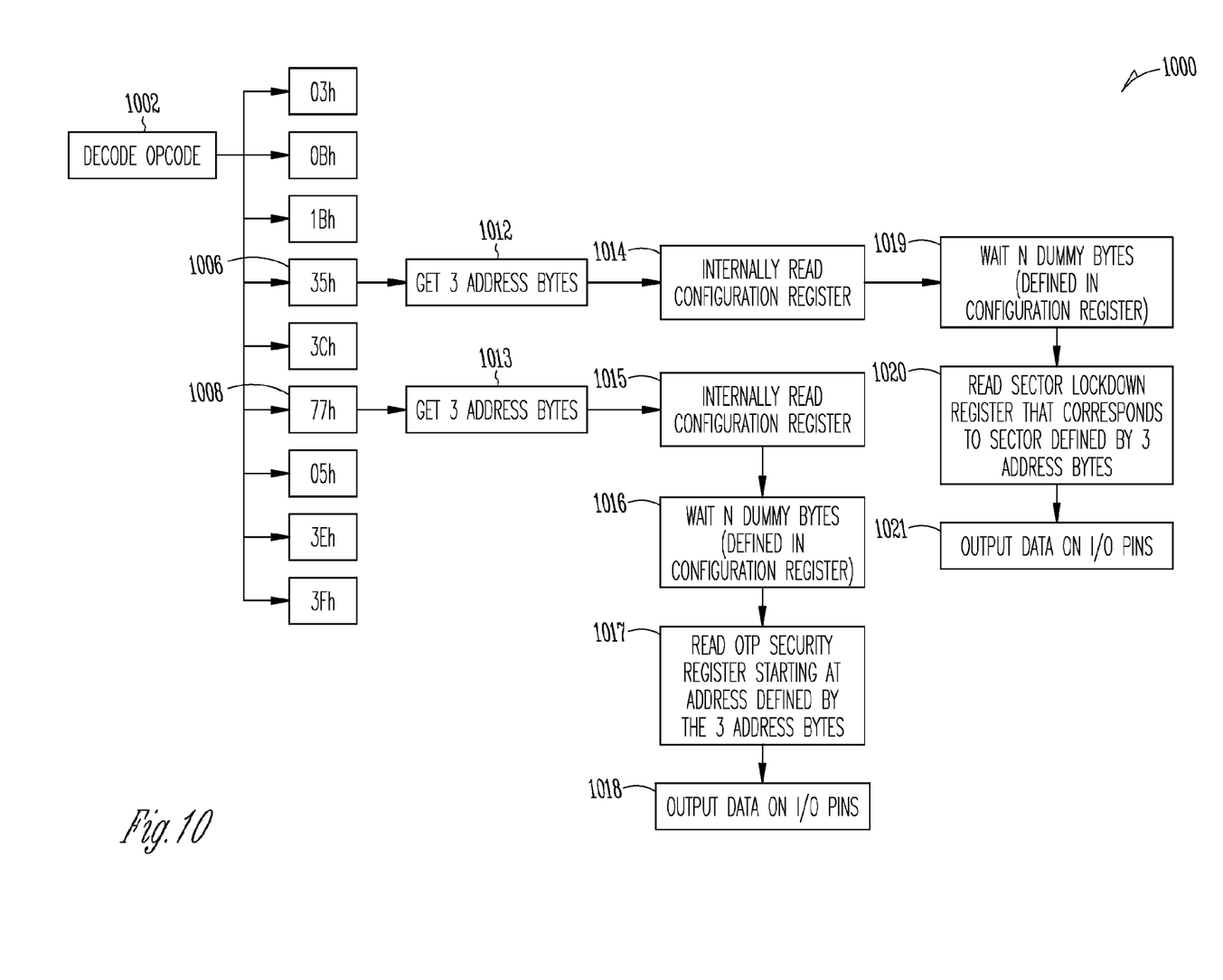
FIG. 10 illustrates a flow diagram of a method of reading a memory using at least one of operational codes 35h and 77h, according to some embodiments of the invention.

FIG. 10 illustrates a flow diagram of a method 1000 of reading a memory using at least one of operational codes 35h and 77h, according to some embodiments of the invention. At block 1002, method 1000 includes decoding opcodes. The various opcodes may include, for example, 03h, 0Bh, 1Bh, 35h, 3Ch, 77h, 05h, 3Eh, and 3Fh (the example of FIG. 10, however, is limited to only opcodes 35h and 77h). In one example, when an opcode (for e.g., 35h shown as block 1006) is decoded, method 1000 proceeds to block 1012. At block 1012, method 1000 includes receiving 3 address bytes and the method 1000 proceeds to block 1014. At block 1014, method 1000 includes reading data from a Configuration Register (for e.g., a programmable latency register 204). After performing the function in block 1014, method 1000 proceeds to block 1019. At block 1019, method 1000 includes waiting "n" number of dummy bytes defined in the Configuration Register. After performing the function in block 1019, method 1000 proceeds to block 1020. At block 1020, method 1000 includes reading a sector lockdown register that corresponds to a sector defined by the 3 address bytes received in block 1012. At block 1021, method 1000 outputs data on the input/output (I/O) pins.

In one example, when an opcode (for e.g., 77h shown as block 1008) is decoded, method 1000 proceeds to block 1013. At block 1013, method 1000 includes receiving 3 address bytes and the method 1000 proceeds to block 1015. At block 1015, method 1000 reads data from a Configuration Register (for e.g., a programmable latency register 204). Upon performing the task in block 1015, method 1000 proceeds to block 1016. At block 1016, method 1000 includes waiting "n" number of dummy bytes that are defined in the Configuration Register. Method 1000 continues by proceeding to block 1017. At block 1017, method 1000 includes reading a One Time Programmable (OTP) security register starting at address defined by the 3 address bytes provided in block 1013. Method 1000 continues to block 1018. At block 1018, method 1000 outputs data on the input/output (I/O) pins.

In addition, within the scope of the present invention a memory may be implemented as a latch, a configuration of cross-coupled inverters, or a single transistor retention device, for example. A data sensing means may be crafted from sense amplifiers, latches, or a register of storage elements to illustrate a few alternatives. An addressing means may be realized from combinatorial circuitry, a compound logic gate, or a controller specialized for address selection processes. A controller means may be implemented by a finite state machine, an embedded controller, or a special-purpose processor for administering a sequence of internal operations, for example. Additionally, any memory device, which may otherwise suffer a delay between decoding a target data byte address and producing the target data at that address, is appropriate for application of the present invention.

A method and system provided herein allows for optimizing the latency while communicating between a host controller and a memory device for any given clock frequency. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b). The Abstract will allow the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with claims standing on their own as separate embodiments and as combinations of the separate embodiments.

What is claimed is:

1. A system comprising:
    a host controller;
    an Input/Output (I/O) buffer; and
    a memory device coupled to the host controller and configured to receive a read command from the host controller, the memory device including an interface control logic in communication with a memory array;
    wherein the interface control logic includes a latency programming circuit coupled to the memory array and the I/O buffer, the latency programming circuit to store at least one value corresponding to a delay to be provided at the memory array prior to transferring data from the memory array during a read operation, and the latency programming circuit configured to provide the delay by incrementing a counter after a number of clock cycles and by comparing the counter with the value corresponding to the delay.

2. The system of claim 1, wherein the latency programming circuit comprises a programmable latency register to store the at least one value corresponding to the delay.

3. The system of claim 2, wherein the memory array includes a FLASH memory.

4. The system of claim 1, wherein the at least one value corresponding to the delay is associated with a number of dummy bytes required to provide the delay.

5. The system of claim 4, wherein the at least one value corresponding to the number of dummy bytes is hardwired using blow-out fuses.

6. The system of claim 4, wherein the at least one value corresponding to the number of dummy bytes is provided in a look-up table.

7. A method of performing a read operation in a memory device, comprising:
    storing a plurality of values corresponding to dummy byte delays associate with at least one read operation;
    sending a read command to the memory device;
    waiting for a time period corresponding to a dummy byte delay for a read command by incrementing a counter after a number of clock cycles and comparing the counter with the value corresponding to the delay; and
    initiating a transfer of data from the memory device.

8. The method of claim 7, wherein storing the plurality of values includes storing the plurality of values corresponding to the dummy byte delays to be received at the memory device.

9. The method of claim 7, wherein storing the plurality of values corresponding to the dummy byte delays includes storing the plurality of values corresponding to the dummy byte delays in a non-volatile memory.

10. The method of claim 7, wherein storing the plurality of values corresponding to the dummy byte delays includes storing the plurality of values corresponding to the dummy byte delays in a look-up table.

11. The method of claim 7, wherein storing the plurality of values of dummy byte delays includes storing the plurality of dummy byte delays associated with a plurality of operational codes used for a read operation.

* * * * *